US012763300B2

(12) United States Patent
Guo et al.

(10) Patent No.: US 12,763,300 B2
(45) Date of Patent: Oct. 13, 2026

(54) METHODS FOR DETECTING ARCING IN POWER DELIVERY SYSTEMS FOR PROCESS CHAMBERS

(71) Applicant: Applied Materials, Inc., Santa Clara, CA (US)

(72) Inventors: Yue Guo, Redwood City, CA (US); Yang Yang, Cupertino, CA (US); Kartik Ramaswamy, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 1415 days.

(21) Appl. No.: 17/351,355

(22) Filed: Jun. 18, 2021

(65) Prior Publication Data

US 2022/0406581 A1 Dec. 22, 2022

(51) Int. Cl.
*H01J 37/32* (2006.01)

(52) U.S. Cl.
CPC .. *H01J 37/32944* (2013.01); *H01J 37/32082* (2013.01); *H01J 2237/0206* (2013.01)

(58) Field of Classification Search
CPC ........... H01J 37/32944; H01J 37/32082; H01J 2237/0206
See application file for complete search history.

(56) References Cited

U.S. PATENT DOCUMENTS 6,967,305 B2 * 11/2005 Sellers .............. H01J 37/32935 219/121.36
7,577,535 B2 8/2009 Anderson et al.
7,611,640 B1 11/2009 Howald et al.
7,761,247 B2 7/2010 van Zyl
8,542,471 B2 9/2013 Bulliard et al.
8,884,180 B2 11/2014 Ilic
2008/0122369 A1 * 5/2008 Nitschke ........... H01J 37/32935 315/111.21

(Continued)

FOREIGN PATENT DOCUMENTS

JP H 10-270426 A 10/1998
WO WO 2009023133 A1 2/2009

OTHER PUBLICATIONS

PCT International Search Report and Written Opinion for PCT/US2022/033712 dated Oct. 11, 2022.

*Primary Examiner* — Ziaul Karim
(74) *Attorney, Agent, or Firm* — Moser Taboada

(57) ABSTRACT

Methods for detecting arcs in power delivery systems for plasma process chambers leverage visible arc detection sensors to facilitate in locating the arc and shutting down a power source associated with arc location. In some embodiments, the method includes receiving an arc indication from an arc detection sensor operating in a visible light spectrum where the at least one arc detection sensor is positioned in an assembly of a power delivery system for a plasma process chamber, determining a location of the arc indication by an arc detection controller of the plasma process chamber, and activating a safety interlock signal to the power source of the power delivery system of the plasma process chamber when the at least one arc indication exceeds a threshold value. The safety interlock signal controls a power status of the power source and activating the safety interlock signal removes power source power.

20 Claims, 6 Drawing Sheets

(56) References Cited

U.S. PATENT DOCUMENTS

| | | | | |
|---|---|---|---|---|
| 2008/0133154 | A1* | 6/2008 | Krauss .............. | H01J 37/32935 702/58 |
| 2008/0257869 | A1* | 10/2008 | Nitschke ........... | H01J 37/32935 219/121.54 |
| 2009/0045046 | A1* | 2/2009 | Pipitone .................. | C23C 14/54 204/192.13 |
| 2009/0161272 | A1* | 6/2009 | Asokan ................ | G01R 31/088 324/536 |
| 2013/0221847 | A1* | 8/2013 | Choi .................. | G01R 19/0061 315/111.41 |
| 2013/0245969 | A1 | 9/2013 | Singlevich et al. | |
| 2014/0070730 | A1* | 3/2014 | Walde ................... | H01J 37/244 315/307 |
| 2014/0265635 | A1* | 9/2014 | Lefeber .............. | G01R 31/1218 324/501 |
| 2015/0381111 | A1 | 12/2015 | Nicolescu et al. | |
| 2016/0233059 | A1 | 8/2016 | Hensley et al. | |
| 2017/0140905 | A1 | 5/2017 | Mihaylov et al. | |
| 2020/0028349 | A1 | 1/2020 | Elliott | |
| 2020/0372629 | A1 | 11/2020 | Chen et al. | |
| 2022/0037135 | A1 | 2/2022 | Kapoor et al. | |

* cited by examiner

METHODS FOR DETECTING ARCING IN POWER DELIVERY SYSTEMS FOR PROCESS CHAMBERS

FIELD

Embodiments of the present principles generally relate to semiconductor manufacturing.

BACKGROUND

Semiconductor process chambers may utilize one or more RF power supplies for plasma generation or biasing of substrates during processing. Auxiliary power equipment such as RF impedance matching networks and/or RF filters may be used in conjunction with an RF power generator. Typical safety protocols for operating the RF power supplies are based on impedance mismatches such as impedance mismatches caused by parasitic plasma conditions in the chamber. When the impedance mismatch occurs the RF power supplies may be shut down to prevent harm to the equipment or personnel. However, the inventors have observed that under non-plasma parasitic conditions an impedance mismatch may not occur and, therefore, safety protocols will leave the RF power generators in operation, leading to equipment damage and possible harm to personnel.

Accordingly, the inventors have provided methods and apparatus for detecting faults in RF power supply equipment even when impedance mismatches do not occur, resulting in higher protection of the RF power supply equipment and personnel.

SUMMARY

Methods and apparatus for detecting arcing in RF power supply equipment are provided herein.

In some embodiments, a method for detecting arcing in a power delivery system may comprise receiving at least one arc indication from at least one arc detection sensor operating in a visible light spectrum, the at least one arc detection sensor positioned in at least one assembly of at least one power delivery system for a plasma process chamber, determining at least one location of the at least one arc indication by an arc detection controller of the plasma process chamber, and activating at least one safety interlock signal to at least one power source of the at least one power delivery system of the plasma process chamber when the at least one arc indication exceeds a threshold value, the at least one safety interlock signal controlling a power status of the at least one power source wherein activating the at least one safety interlock signal removes power from the at least one power source.

In some embodiments, the method may further include wherein the at least one arc indication includes intensity of an arc, duration of an arc, or location of an arc within an assembly of the power delivery system, wherein one of the at least one arc detection sensor is configured to provide an intensity of an arc in a range of approximately 10,000 lux to approximately 20,000 lux, wherein one of the at least one arc detection sensor is a fiber optic sensor, wherein a plurality of fiber optic sensors is positioned in one of the at least one assembly of the at least one power delivery system to monitor specific parts, wherein one of the at least one arc detection sensor has a 180 degree field of detection, wherein one of the at least one arc detection sensor has a 360 degree field of detection, receiving operating parameters from a controller of the plasma process chamber associated with a time of the at least one arc indication and providing a diagnosis of possible causes of the at least one arc indication based, at least in part, on the operating parameters, the at least one arc indication, and the at least one location of the at least one arc indication, wherein operating parameters from the controller of the plasma process chamber include chamber pressure, power level, chemistry of a process, impedance match network capacitor positions, or chamber impedance, and/or providing an indication of the location of the at least one arc indication, wherein the indication is viewable by personnel operating the plasma process chamber.

In some embodiments, a method for detecting arcing in a power delivery system may comprise receiving at least one arc indication from at least one arc detection sensor operating in a visible light spectrum, the at least one arc detection sensor positioned in at least one assembly of at least one power delivery system for a plasma process chamber, wherein the at least one arc indication includes intensity of an arc, duration of an arc, or location of an arc within an assembly of the power delivery system and wherein at least one arc detection sensor is configured to provide an intensity of an arc in a range of approximately 10,000 lux to approximately 20,000 lux, determining at least one location of the at least one arc indication by an arc detection controller of the plasma process chamber, and activating at least one safety interlock signal to at least one power source of the at least one power delivery system of the plasma process chamber when the at least one arc indication exceeds a threshold value, the at least one safety interlock signal controlling a power status of the at least one power source wherein activating the at least one safety interlock signal removes power from the at least one power source.

In some embodiments, the method may further include wherein one of the at least one arc detection sensor is a fiber optic sensor, wherein a plurality of fiber optic sensors is positioned in one of the at least one assembly of the at least one power delivery system to monitor specific parts, wherein one of the at least one arc detection sensor has a 180 degree field of detection or a 360 degree field of detection, receiving operating parameters from a controller of the plasma process chamber associated with an occurrence of the at least one arc indication and providing a diagnosis of possible causes of the at least one arc indication based, at least in part, on the operating parameters, the at least one arc indication, and the at least one location of the at least one arc indication, wherein operating parameters from the controller of the plasma process chamber include chamber pressure, power level, chemistry of a process, impedance match network capacitor positions, or chamber impedance, and/or providing an indication of the location of the at least one arc indication, wherein the indication is viewable by personnel operating the plasma process chamber.

In some embodiments, a non-transitory, computer readable medium having instructions stored thereon that, when executed, cause a method for detecting arcs in a power delivery system to be performed, the method comprising receiving at least one arc indication from at least one arc detection sensor operating in a visible light spectrum, the at least one arc detection sensor positioned in at least one assembly of at least one power delivery system for a plasma process chamber, determining at least one location of the at least one arc indication by an arc detection controller of the plasma process chamber, and activating at least one safety interlock signal to at least one power source of the at least one power delivery system of the plasma process chamber when the at least one arc indication exceeds a threshold value, the at least one safety interlock signal controlling a power status of the at least one power source wherein activating the at least one safety interlock signal removes power from the at least one power source.

In some embodiments, the method may further include receiving operating parameters from a controller of the plasma process chamber associated with an occurrence of the at least one arc indication and providing a diagnosis of possible causes of the at least one arc indication based, at least in part, on the operating parameters, the at least one arc indication, and the at least one location of the at least one arc indication, and/or wherein operating parameters from the controller of the plasma process chamber include chamber pressure, power level, chemistry of a process, impedance match network capacitor positions, or chamber impedance.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
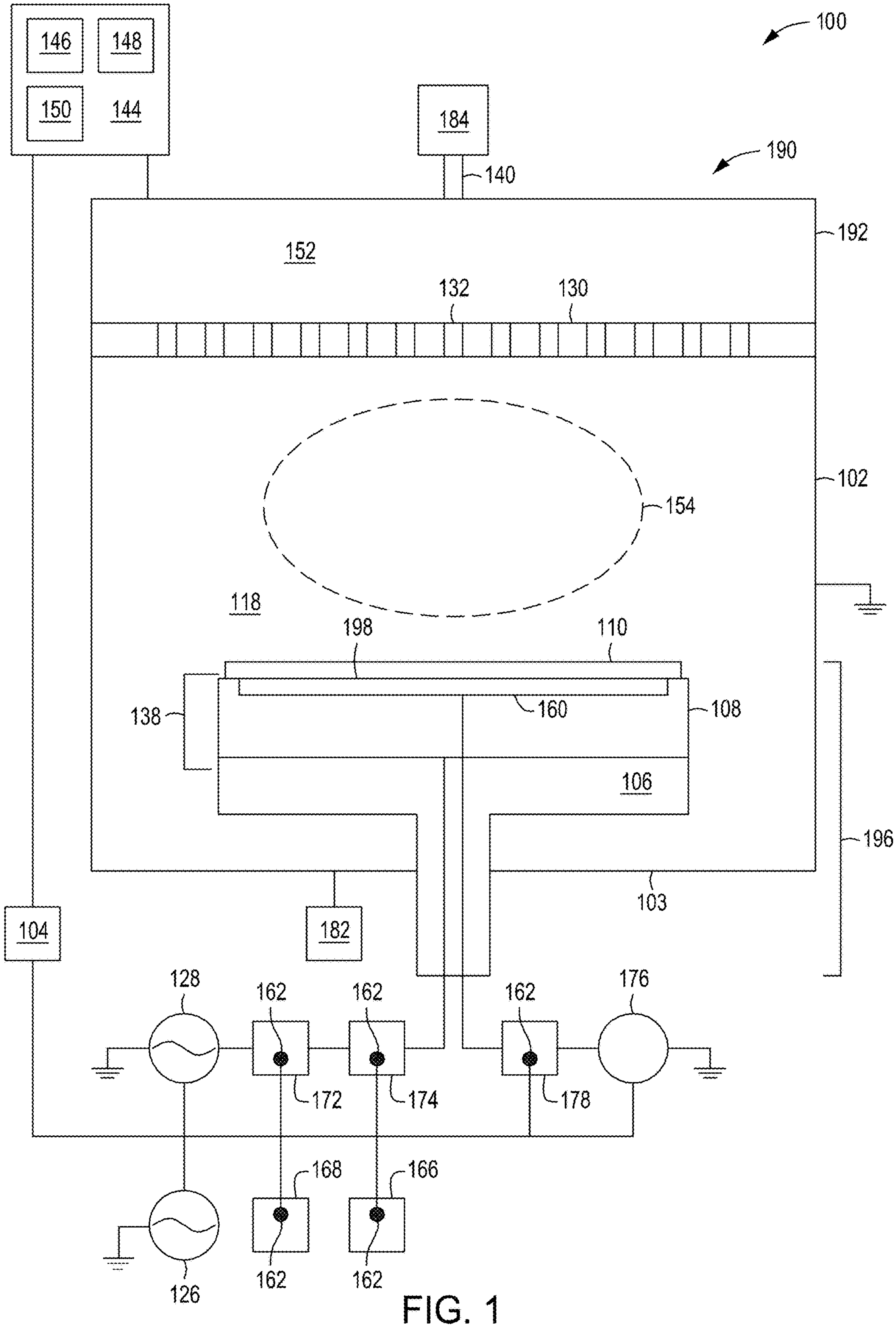
FIG. 1 depicts a cross-sectional view of a plasma chamber in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods and apparatus provide additional protection to RF power supply equipment used, for example, in semiconductor process chambers. Arc detection by visible light spectrum detectors protects the RF power supply equipment even when impedance mismatches do not occur, saving expensive equipment and possibly harm to personnel. Signals from the light sensors are sent to a visible arc detector controller and compared with a preset threshold value. If the threshold value is met, a system safety interlock switch is activated which shuts down the RF generators immediately. The methods and apparatus of the present principles have the advantages of wide detection angles in the light sensors to cover all of the RF enclosures, arc detectors have very fast response times, arc detectors can protect RF power systems from serious damage, especially in parasitic situations where no plasma to alter the RF impedance and, subsequently, the reflected power, and exact arcing location detection for root cause analysis and design optimization.

Typically, RF generators are shut off when high reflected power is detected (generally occurring due to impedance mismatch). However, the detection of high reflected power does not cover all fault conditions. When RF matches tune to some instances where a parasitic condition exists without the formation of plasma, reflected power can still be low and a fault will not be detected. When correctly operating, the plasma in the process chamber provides a current load which maintains voltages in and out of the chamber at a safe level. When no plasma is being formed in the chamber, the voltages in the chamber and power delivery system may continue to build up until the voltages are high enough to arc across components. Without a reflected power fault being detected, RF generators will continue to deliver power to a parasitic load where arcing can consequently occur inside RF impedance matching networks and/or RF filter enclosures, resulting in serious power supply equipment damage, system overheating, and possibly fires. The methods and apparatus of the present principles utilize a visible arc detector positioned in the power supply equipment enclosures to trigger a system safety interlock switch in order to reduce potential hazards and system damages. Light sensors act as arc detectors and are distributed in RF impedance matching networks and RF filter boxes and may be positioned near high voltage areas in the enclosures. The light sensors may have a wide half sphere (180 degrees) or a complete sphere (360 degrees) detection angle or a narrow detection angle for the light sensor field of view (FOV). The light sensors may also have different sensitivities and detection ranges. In some embodiments, an arc detector controller may be used in conjunction with the light sensors. Signals form the light sensors are sent to the arc detector controller and compared with a preset threshold value. If the signals from one or more light sensors exceeds the threshold value, an arc has occurred in the power delivery system. A system safety interlock switch is then activated, and interlocks signals are used to shut off the RF generators immediately.

Figure 8:
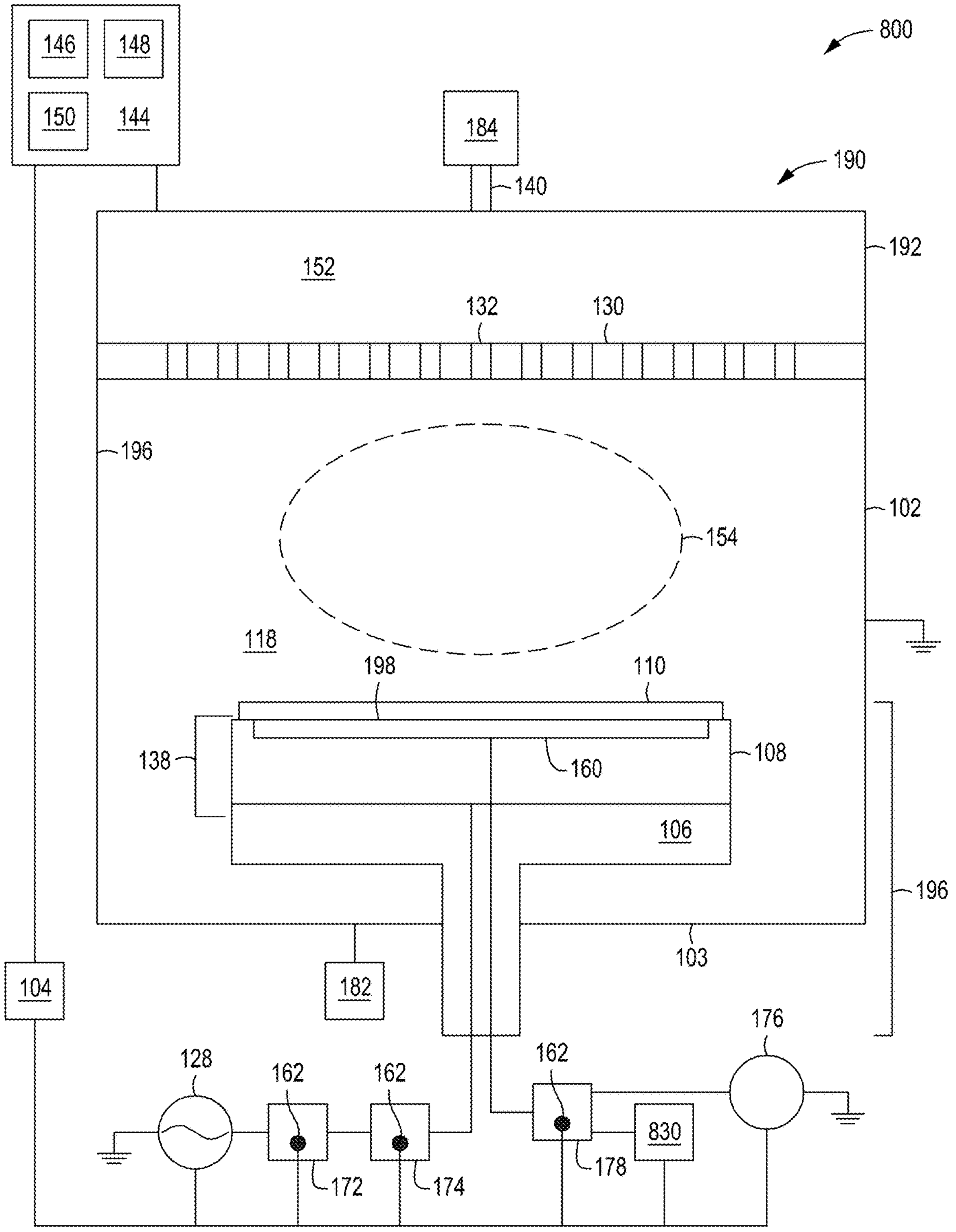
FIG. 8 is a cross-sectional view of a plasma chamber in accordance with some embodiments of the present principles.

The methods and apparatus of the present principles may be used in many different types of process chambers with power delivery systems of different configurations of power generators (DC and RF generators, pulsed and non-pulsed generators, etc.) which have different configurations of auxiliary support assemblies (RF filters, DC filters, impedance match networks, etc.). FIGS. 1 and 8 are examples of plasma process chambers for dielectric etching. However, the embodiments describe herein may also be used with process systems configured for use in other plasma-assisted processes such as plasma-enhanced deposition processes including plasma-enhanced chemical vapor deposition (PECVD) processes, plasma-enhanced physical vapor deposition (PEPVD) processes, plasma enhance atomic layer deposition (PEALD processes, plasma treatment processing or plasma-based ion implant processing such as plasma doping (PLAD) processing.

FIG. 1 depicts a cross-sectional view of one example configuration of a plasma chamber 100 in accordance with some embodiments. The plasma chamber 100 represents an example chamber (not intended to be limiting) in which the methods and apparatus of the present principles may be incorporated. The plasma chamber 100 may be used, for example, but not limited to, etching of materials on a substrate 110 to form semiconductor structures. Other process chambers that can utilize the methods and apparatus may be used for deposition, degassing, heating, substrate warp removal, etc. The plasma chamber 100 is configured to form a capacitively coupled plasma (CCP) 154 in a processing volume 118. In some embodiments, an RF power source 128 for plasma production is delivered to an RF baseplate 108 within a cathode assembly 138, whereas a gas distribution plate 130 of the lid 190 is grounded. In some embodiments (not shown), the gas distribution plate 130 may be biased. The plasma chamber 100 includes a cylindrical sidewall 102, a floor 103, and a lid 190. The lid 190 may be a gas distribution showerhead including a gas manifold 152 overlying a gas distribution plate 130 having orifices 132 formed through the gas distribution plate 130. The gas manifold 152 is enclosed by a manifold enclosure 192 having a gas supply inlet 140. A gas panel 184 controls the individual flow rates of different process gases to the gas supply inlet 140. The substrate 110 is supported on a top surface 198 of a pedestal 196 with or without an electrostatic chuck (ESC) and with the RF baseplate 108 which is supported by a pedestal support 106. A pump 182 is connected to the plasma chamber 100 for exhausting the interior of the plasma chamber 100 and to facilitate maintaining a desired pressure inside the plasma chamber 100.

In the example chamber, the RF power source 128 provides RF power to the RF baseplate 108 to generate plasma for etching the substrate 110 during processing. A first RF filter 174 and a first RF impedance match network 172 are disposed between the RF power source 128 and the RF baseplate 108. For example, RF energy supplied by the RF power source 128 may range in frequency from about 13 MHz to about 162 MHz, for example, non-limiting frequencies such as 13.56 MHz, 60 MHz, 120 MHz, or 162 MHz can be used. In some embodiments, a pulsed RF power source 128 may provide high voltage pulsing RF power and the like. The pulsed RF power may have a frequency of approximately 100 Hz to approximately 5 kHz with a duty cycle ranging from approximately 5% to approximately 95%. In some embodiments, the RF or pulsed RF power source 128 may provide RF or pulsed RF power in range from approximately 1 kW to approximately 20 kW. In some embodiments, the RF or pulsed RF power source 128 may provide RF or pulsed RF power in range from approximately 20 kW to approximately 60 kW.

An RF bias power source 126 may be coupled to the RF baseplate 108 in order to induce bias control on the substrate 110. The RF baseplate 108 is fed RF bias power from the RF bias power source 126 through a second RF filter 166 and a second RF impedance match network 168. For example, RF energy supplied by the RF bias power source 126 may range in frequency from about 100 kHz to about 20 MHz, for example, non-limiting frequencies such as 2 MHz or 13.56 MHz can be used. The RF bias power may also be pulsed. In some embodiments, the RF power may be supplied by the RF bias power source 126 in a range from approximately a few tens of watts to a few hundreds of watts. In some embodiments, the RF power supplied by the RF bias power source 126 may be approximately a few kilowatts up to 10 kW. In other applications, the pedestal 196 may be grounded or left electrically floating. Electrostatic chucking electrodes 160 are fed positive and negative high-voltage DC power from a high voltage DC power source 176 via a low pass filter 178. The electrostatic chucking electrodes 160 form a static charge on a top surface of the pedestal 196 to hold the substrate 110 during processing. In some embodiments, the plasma chamber 100 may have another electrode at the edge for edge uniformity control.

A controller 144 may be provided and coupled to various components of the plasma chamber 100 to control the operation thereof. The controller 144 includes a central processing unit (CPU) 146, a memory 148, and support circuits 150. The controller 144 may control the plasma chamber 100 directly, or via computers (or controllers) associated with a particular process chamber and/or support system components. The controller 144 may be one of any form of general-purpose computer processor that can be used in an industrial setting for controlling various chambers and sub-processors. The memory, or computer readable medium, 148 of the controller 144 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 150 are coupled to the CPU 146 for supporting the processor in a conventional manner. These circuits include cache, power supplies, clock circuits, input/output circuitry and subsystems, and the like. Methods to control the plasma chamber 100 and/or arc detection processes may be stored in the memory 148 as software routine that may be executed or invoked to control the operation of the plasma chamber 100 in the manner described herein. The software routine may also be stored and/or executed by a second CPU (not shown) that is remotely located from the hardware being controlled by the CPU 146. For example, in some embodiments, recipes and/or arc detection diagnostics or arc detection processes may be stored in the controller 144, and the controller 144 may interface with a visible arc detector controller 104 to facilitate in detecting arcing in power delivery systems of the plasma chamber 100.

The visible arc detector controller 104 is connected to assemblies of the power delivery system for the plasma chamber 100 to control applied power to one or more of the assemblies and also to detect arcing via one or more light detectors 162 installed in one or more assemblies. FIG. 1 is an example of possible locations of light detectors 162 and is not meant to be limiting as to which assemblies may have light detectors 162 nor the quantity of light detectors 162 installed in each assembly. In the example, the power delivery system may include assemblies such as the RF power source 128, the first RF impedance match network 172, the RF bias power source 126, the second RF impedance match network 168, and the second RF filter 166. An RF impedance match network is an electrical circuit used between an RF source generator and a plasma reactor to optimize power delivery efficiency. At the tuned impedance matching point, maximum power is delivered into the plasma load and near zero power is reflected to the RF source. An example RF impedance match network includes a motorized variable shunt capacitor, a motorized variable series capacitor, and series inductance elements. Circuit configurations are typically an L network or a pi network. In order to combine different RF powers to the target, RF filters are required between RF impedance match networks and the plasma reactor. The RF filters are designed to only allow power in a selected frequency range and to isolate RF power supplies from each other.

The methods and apparatus of the present principles are applicable for use in other chamber configurations such as the chamber depicted in FIG. 8. Although the chambers of FIGS. 1 and 8 may be used in etching processes, the methods and apparatus are not limited to etching chambers alone. In FIG. 8, the plasma chamber 800 incorporates a waveform generator 830 connected via the low pass filter 178 to the electrostatic chucking electrodes 160 beneath the substrate 110. The waveform generator 830 produces DC waveforms such as pulses or ramp waveforms and the like in the electrostatic chucking electrodes 160. The low pass filter 178 prevents RF from traveling to the waveform generator 830 and/or the high voltage DC power source 176 during processing in the plasma chamber 800. The visible arc detector controller 104 may be connected to light detectors 162 in any of the assemblies associated with the high voltage DC power source 176 and/or the RF power source 128 (e.g., the first RF filter 174, the first RF impedance match network 172, the low pass filter 178, etc.). The visible arc detector controller 104 may also be connected to one or more of the assemblies of the RF power delivery system and/or one or more assemblies of the DC power delivery system including the waveform generator 830 to control power applied to the assemblies.

RF reflected powers are typically well monitored to protect against sudden impedance changes in a process chamber. RF source generators are shut off when high reflected power is detected to avoid damaging the power delivery system. However, using reflected power to determine faults cannot cover all possible fault situations. Under some conditions, parasitic loads where no plasma is formed can have impedances within the match tuning range and not substantially alter the reflected power. When RF impedance match networks tune to parasitic conditions with no plasma present, the reflected power is still low, and the system cannot capture the faults. RF source generators will continue to deliver power to a parasitic condition with no plasma load, building up high voltages in the chamber and power delivery assemblies. Arcing may subsequently occur inside the RF impedance match network and/or RF filter enclosures due to the fault, resulting in serious power supply damages, system overheating, and even fires.

Figure 2:
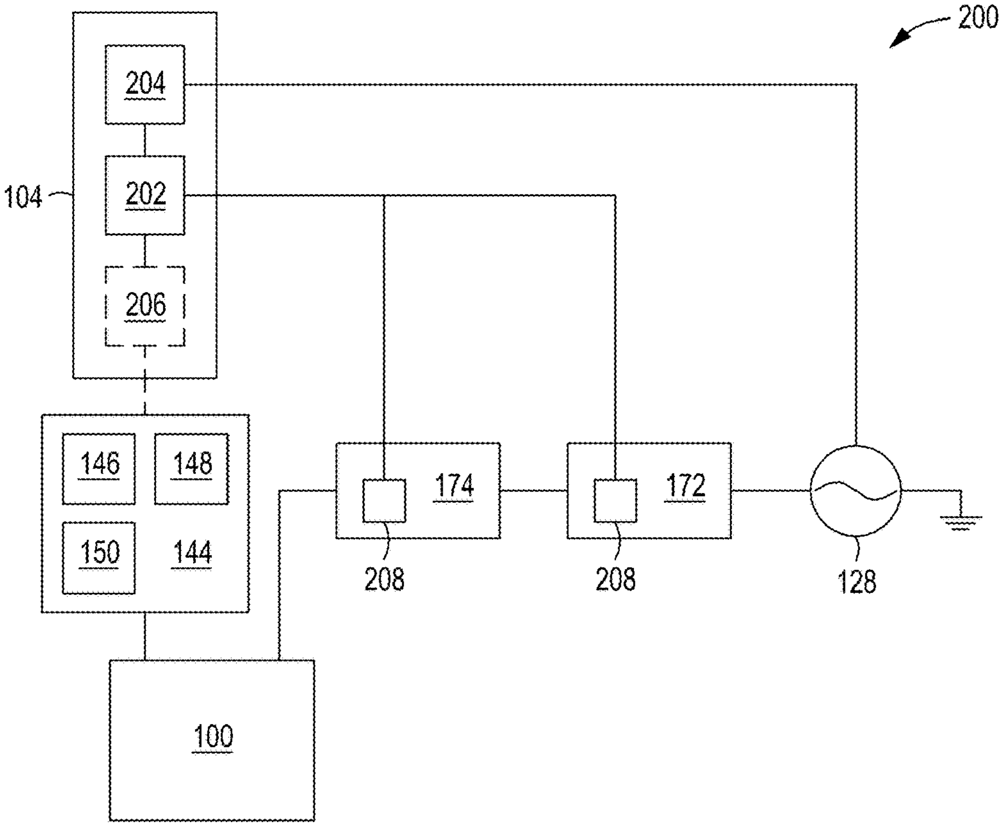
FIG. 2 depicts a cross-sectional view of a power delivery system in accordance with some embodiments of the present principles.

In order to reduce potential hazards and system damages, a visible arc detector controller 104 can be used to trigger a system safety interlock switch. The system safety interlock switch controls the operational status of the RF source generators in the example process chambers. FIG. 1 depicts a visible arc detector controller 104 in an RF plasma processing system using the plasma chamber 100 and FIG. 8 depicts the visible arc detector controller 104 in an RF plasma processing system using the plasma chamber 800. FIG. 2 is a view 200 of the plasma power delivery system of the plasma chamber 100 (or the plasma delivery system of the plasma chamber 800) and depicts light sensors 208 distributed in the first RF impedance match network 172 and the first RF filter 174, especially near the high voltage areas (e.g., the match and filter outputs) inside the power delivery system assemblies. Similarly, the second RF impedance match network 168 and the second RF filter 166 may also have light sensors 208 distributed inside and connected to the visible arc detector controller 104. The light sensors can have a wide 180 degree half sphere or 360 degree sphere detection angle or a narrow detection angle to detect arcing faults within the power delivery system assemblies. Signals from the light sensors 208 are sent to the visible arc detector controller 104 to an arc monitor 202 and compared with a preset threshold value stored in memory of the arc monitor 202 and/or in memory in the controller 144 if so connected. If signals from one or more light sensors exceed the threshold value, an arc fault has is declared in the power delivery system. When the arc fault is detected, a system safety interlock switch is activated by the safety interlock controller 204 and the interlock signals are sent out to shut off any associated RF source generators immediately. In some embodiments, the light sensors can be installed at multiple locations in the electrical assemblies including near outputs of RF filters and RF impedance match networks where voltages are high. If the light intensity is more than a preset threshold value, for example, between approximately 10,000 lux to approximately 20,000 lux, an interlock signal can be sent to the RF source generators to shut off the power within approximately 100 ms or less. Since an ambient light intensity level of an office area or laboratory is usually below 2000 lux, the interlock signal is closed in normal operation conditions and would not be triggered by the ambient lighting even if an assembly of the power delivery system was opened.

The methods and apparatus of the present principles can also be used for fault analysis and diagnostics of both the process chamber and the power delivery system. An optional diagnostic system 206 of the visible arc detector controller 104 may facilitate in determining faulty components within the power system and/or with in the process chamber or even within process recipes used by the process chamber. The optional diagnostic system 206 may use look up tables based on prior knowledge and/or may also incorporate machine learning to aid in diagnosing causes of the arcing. In some embodiments, the optional diagnostic system 206 may be connected to the controller 144 of the plasma chamber 100. The optional diagnostic system 206 may utilize operational parameters at the moment of the detected arc and/or prior to the moment of the detected arc from the plasma chamber 100 to assist in diagnosis. Often the events that occur leading up to the arcing can greatly assist in determining why the arcing has occurred. As the optional diagnostic system 206 may use machine learning, historical data and/or current operating parameters may be constantly monitored to determine in advance if a fault is likely to occur and also in which assembly of the power delivery system the fault may occur, preventing damage to equipment and possibly personnel as well. Visible arc detector controllers incorporating the optional diagnostic system 206 may also incorporate light sensors with higher accuracies and/or advanced capabilities that provide additional information when an arc is detected. For example, the light sensor may have the capability to report the arc occurrence along with an intensity level value, a detection angle (where the arc occurred within the detection FOV of the light sensor), time of detection, duration of arcing, and/or number of arcs detected and the like. The more sophisticated light sensors are more costly but also provide data needed for diagnosing the cause of arcs and may be used during testing or evaluation phases of chamber design rather than in production chambers. Light intensity and/or location data can be used for early detection, fault analysis and arc hazard mitigation, along with other chamber parameters, including but not limited to, chamber pressure, power level, chemistry, match capacitor positions, chamber impedance, etc. In some embodiments, a safe operating regime can be obtained by varying process conditions while monitoring the intensity of fiber optic sensors.

The light sensors may have wide detection angles to cover the whole area of an RF impedance match network enclosure and an RF filter enclosure. Compared with software-based detection methods, the visible arc detector controller 104 has a faster response time of under 100 ms. The visible arc detector controller 104 can protect RF power systems from serious damages, especially in some tuned parasitic no plasma situations, where RF power supplies cannot be shut off properly due to no reflected power spikes. The methods and apparatus can also be used to determine exact arcing locations and help for root cause analysis and system design optimization. Fiber optic sensors may also be used as light sensors to detect arcing and may be placed at multiple locations to facilitate in determining a fault location within a given assembly of the power delivery system. Fiber optic sensors have the advantage of being very small and easy to locate within the assemblies of the power delivery systems.

Figure 3:
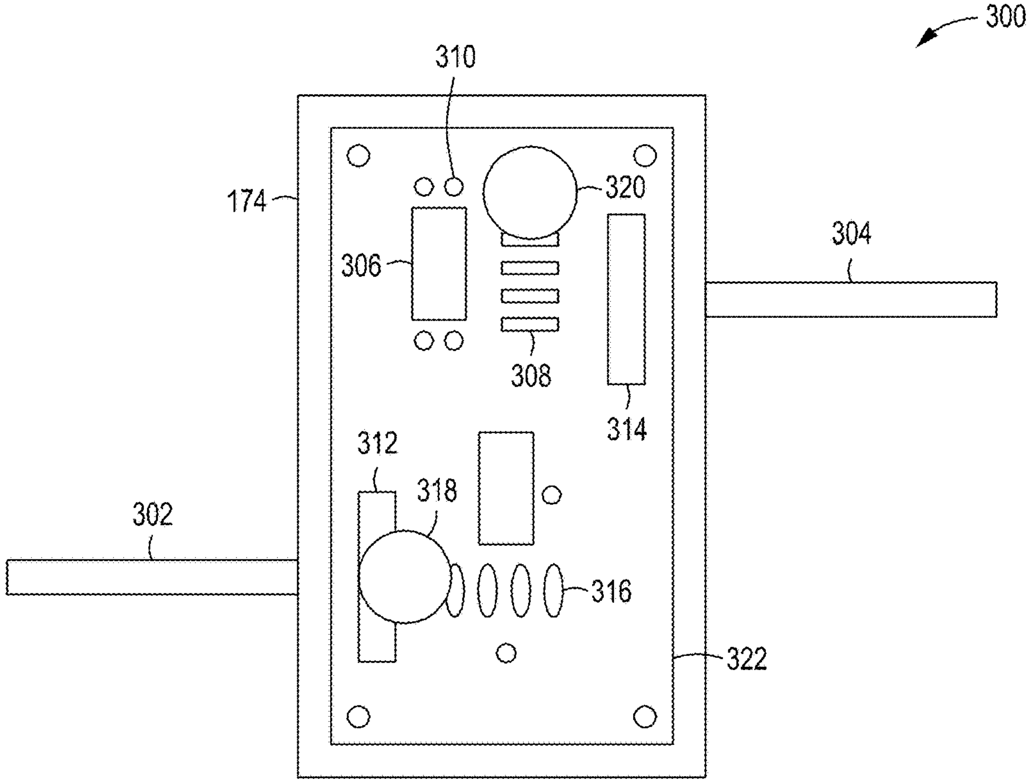
FIG. 3 depicts a top-down view of an RF filter of a power delivery system in accordance with some embodiments of the present principles.

The following examples, for the sake of brevity, reference the first RF filter 174 as an example assembly of a power delivery system and are not meant to be limiting as the methods and apparatus are applicable to other assemblies of the power delivery system. FIG. 3 depicts a top-down view 300 of the first RF filter 174 with a top cover removed. The first RF filter 174 has an output cable 302 connected to an output connector 312 on an assembly board 322 and an input cable 304 connected to an input connector 314. A first light sensor 318 is mounted directly above the output section of the first RF filter 174 to monitor the output section explicitly. The detection FOV of the first light sensor 318 may be very broad and may also be used to monitor nearby components such as capacitors 316. A second light sensor 320 may be positioned near an input section of the first RF filter 174 to monitor an inductor 306 or other components 310 along with resistors 308 due to the second light sensor's wide detection FOV. By using multiple light sensors, the visible arc detector controller 104 can further pinpoint not only which assembly the fault occurred in but also where within the assembly the fault occurred. The arc location information can aid in diagnosing why the fault occurred which is useful both in repair and also in designing future chambers.

Figure 4:
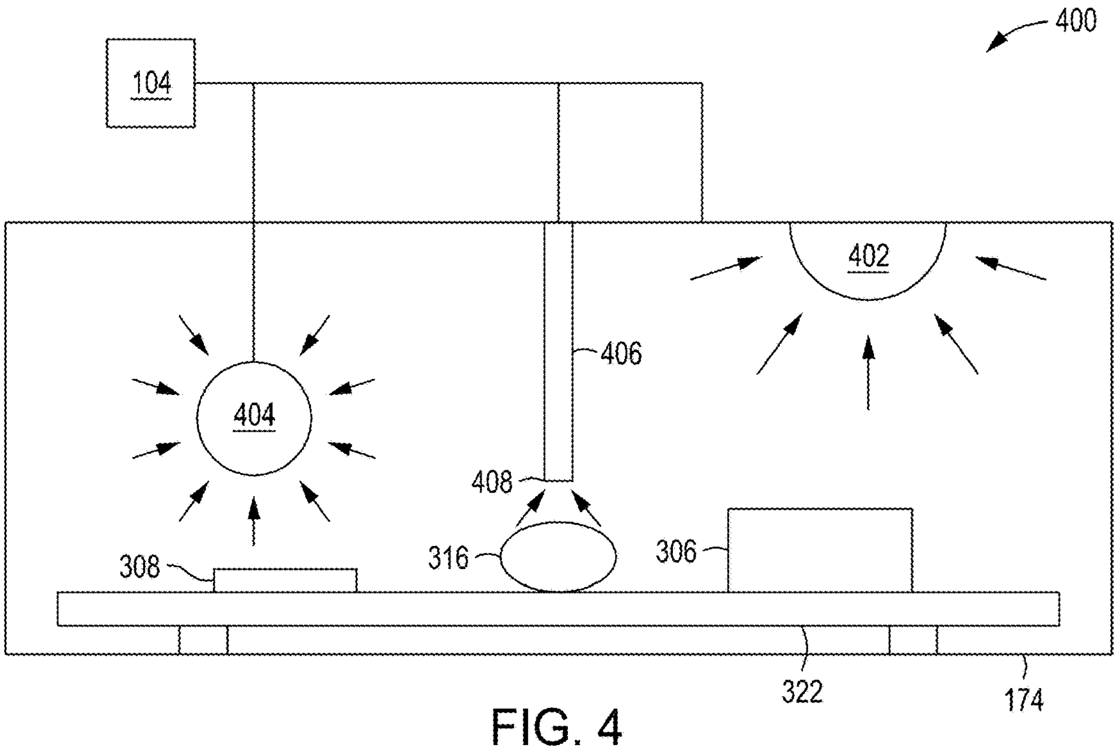
FIG. 4 depicts a cross-sectional view of an RF filter with arc detectors in accordance with some embodiments of the present principles.

FIG. 4 is a cross-sectional view 400 of the first RF filter 174 depicting a first light sensor 402 with a 180 degree detection FOV, a second light sensor 404 with a 360 degree detection FOV, and a third light sensor 406 with a narrow FOV. The first light sensor 402 may be mounted above or to the side of components in the first RF filter 174 to allow for maximum coverage within the first light sensor's 180 degree detection FOV. The first light sensor 402 may also be mounted on a sidewall of the first RF filter 174 as well. The second light sensor 404 may be mounted away from the sides of the first RF filter 174 to allow for maximum coverage using the second light sensor's 360 degree detection FOV. The second light sensor 404 may be placed in amongst or between components to provide coverage from all sides. The third sensor 406 has a narrow detection FOV and may be positioned directly above (shown) or to the side of a particular area or component within the first RF filter 174. The third light sensor 406 may be a fiber optic sensor where light is absorbed only at a tip 408 of the sensor. With a narrow detection FOV, very specific components or areas of the first RF filter 174 can be monitored for arcing. In some embodiments, a plurality of fiber optic based sensors can be positioned in a grid pattern above components in an assembly of a power delivery system to very accurately locate an arc and, based on the number of fiber optic based sensors that detect the arc, determine the size of the arc and if exactly which one or ones of the components were affected inside the assembly.

Figure 5:
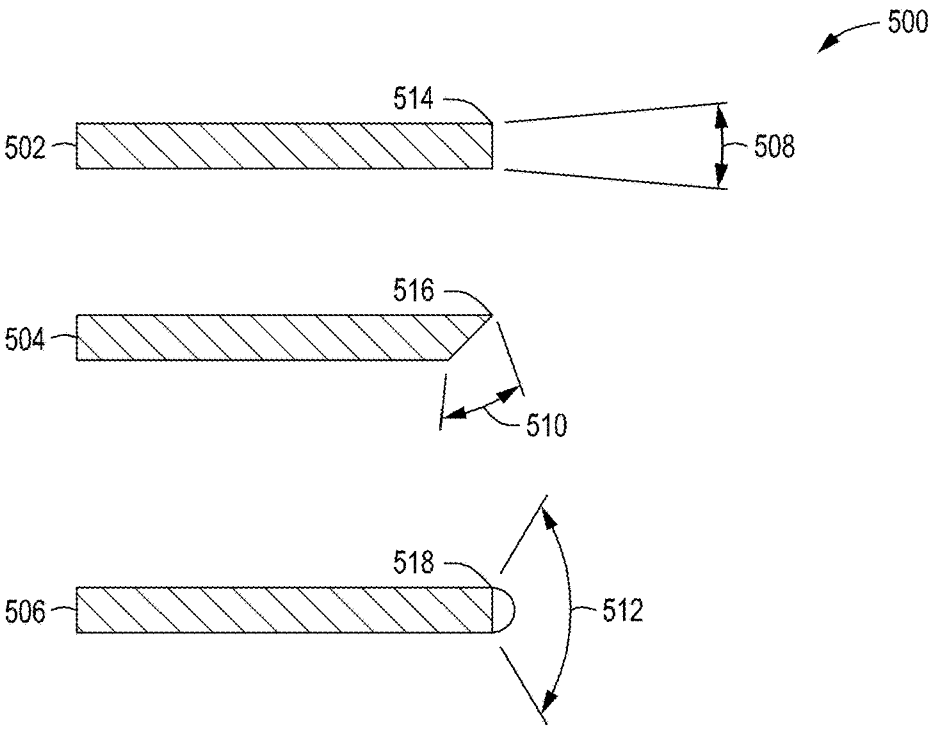
FIG. 5 depicts a cross-sectional view of fiber optic arc detectors in accordance with some embodiments of the present principles.
Figure 6:
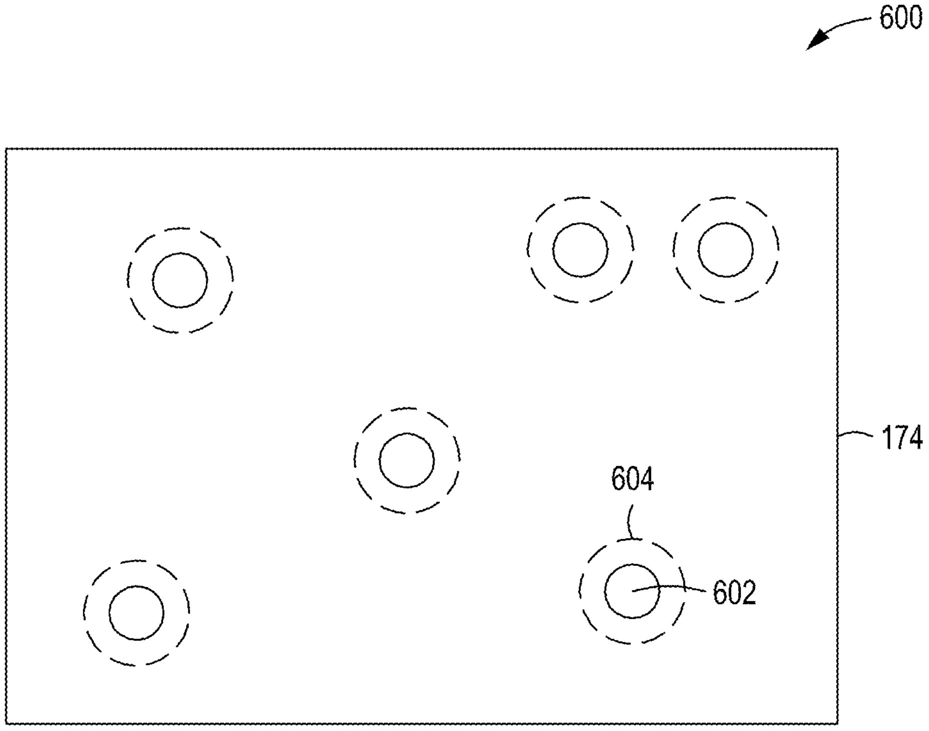
FIG. 6 depicts a top-down view of fiber optic arc detectors in an RF filter in accordance with some embodiments of the present principles.

FIG. 5 depicts a cross-sectional view 500 of fiber optic arc detectors in accordance with some embodiments. Light sensors that are based on fiber optics are very small in diameter and allow for a wide range of applications and placements that may not be possible with other types of light sensors. A first fiber optic arc detector 502 has a 90 degree cut polished end 514 which allows detection of light in a narrow detection FOV 508. In some embodiments, the narrow detection FOV 508 may be from approximately 20 degrees to approximately 30 degrees. The narrow detection FOV 508 allows the first fiber optic arc detector 502 to be positioned to monitor a specific component or location within an assembly with a significant suppression of cross-talk from arc faults occurring in other areas of the same assembly. The second fiber optic arc detector 504 has a similar detection FOV 510 as the first fiber optic arc detector 502 in the range of 25 degrees to 35 degrees. The advantage of the second fiber optic arc detector 504 is the 45 degree cut polished end 516 which allows detection perpendicular to the second fiber optic arc detector 504, allowing entry of the second fiber optic arc detector 504 into an assembly enclosure from the side instead of the top or allowing entry from the top to monitor a side of a component and the like in an assembly. A third fiber optic arc detector 506 has a rounded polished end 518 that allows for a much wider FOV 512. The wider FOV 512 permits the third fiber optic detector 506 to be substituted for a 180 degree light sensor but with a much smaller form factor that is easier to position within the assembly. The wider FOV 512 may be up to approximately 180 degrees. A view 600 in FIG. 6 depicts a top-down view of a plurality of fiber optic arc detectors 602 positioned in the first RF filter 174. In the example, the plurality of fiber optic arc detectors 602 have narrower detection FOVs 604 to allow for arc detection in specific areas of the first RF filter 174 to provide enhanced location determination of any arcing within an assembly of the power delivery system.

Figure 7:
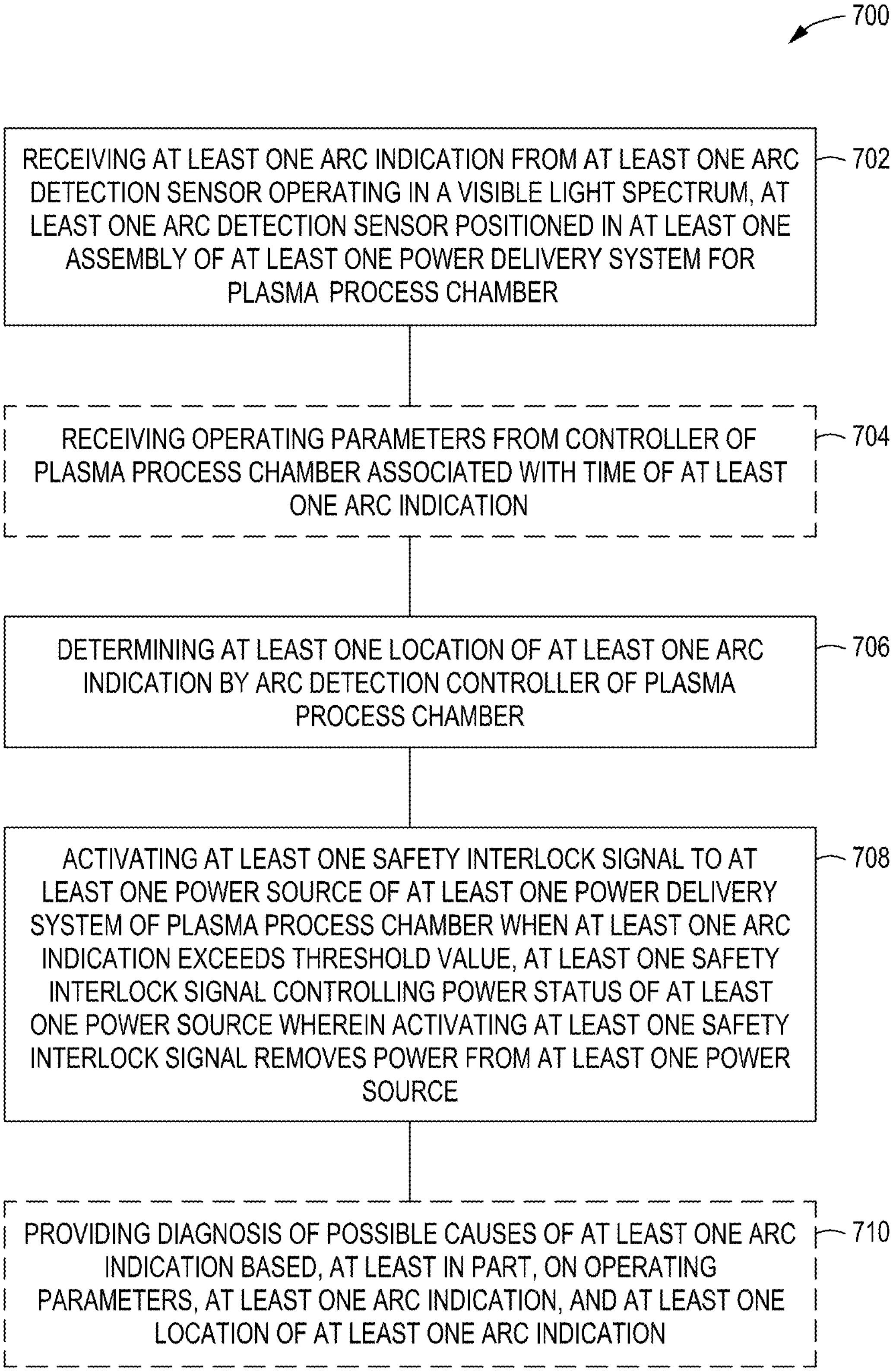
FIG. 7 is a method of detecting arcs in a power delivery system in accordance with some embodiments of the present principles.

FIG. 7 is a method 700 of detecting arcs in a power delivery system in accordance with some embodiments. In block 702, at least one arc indication is received from at least one arc detection sensor operating in a visible light spectrum (wavelengths from 380 nm to 700 nm). The arc detection sensor is positioned in at least one assembly of at least one power delivery system for a plasma process chamber. The arc indication may include intensity of an arc, duration of an arc, angle of arc detection, and/or location of an arc and the like within an assembly of the power delivery system. In some embodiments, the arc detection sensor may be configured to provide an intensity of an arc in a range of approximately 10,000 lux to approximately 20,000 lux. In some embodiments, the arc detection sensor may be a fiber optic sensor. A plurality of fiber optic sensors may also be positioned in one of the assemblies of one of the power delivery systems to monitor specific parts of the assembly. The arc detection sensor may also be a light sensor with a 180 degree field of detection or with a 360 degree field of detection.

In optional block 704, operating parameters are received from a controller of the plasma process chamber associated with a time or occurrence of the at least one arc indication. In some embodiments, the operating parameters from the controller of the plasma process chamber may include, but are not limited to, chamber pressure, power level, chemistry of a process, impedance match network capacitor positions, and/or chamber impedance. The status of the operating parameters assists in determining why a particular arc occurred and also enables the ability to possibly prevent an arc from occurring. In block 706, at least one location of the arc indication is determined by a visible arc detection controller of the plasma process chamber. In simplest form, the visible arc detection controller may simply be wired to know that input 1 is an RF filter and input 2 is an RF impedance match network of a first RF power source. If a status of the input 1 changes from low to high (input voltage) or from high to low (input grounded), the visible arc detection controller knows the RF filter has arced and shuts down the first RF power source. In more complex embodiments, multiple arc detection sensors may be employed in the first RF filter and the visible arc detector controller may utilize additional logic (e.g., which sensors (sensor self-identifying) and how many reported the arcing, angle of detection, intensity value, etc.) to determine which particular area or component of the first RF filter has arced.

In block 708, at least one safety interlock signal to at least one power source of the at least one power delivery system of the plasma process chamber is activated when the arc indication exceeds a threshold value. The at least one safety interlock signal controls a power status of the power source and activating the safety interlock signal removes power from the power source. In some embodiments, the visible arc detector controller may be able to identify a fault that is common in other power sources and is likely to occur under the present process chamber conditions. The visible arc detector controller may then send safety interlock signals to multiple power sources in order to prevent damage from occurring in other systems. In some embodiments, an indication of the location of the arc indication may be viewable by personnel operating the plasma process chamber and/or at a remote location such as a monitoring station and the like. Because arcing can be dangerous to personnel, the visible arc detector controller may also display a warning sign or other indication (e.g., an audible alarm, a visual alarm, etc.) to keep personnel safe in the local area of the process chamber or power system and/or in monitoring areas to alert personnel to possible damage or even fires.

In optional block 710, a diagnosis of possible causes of the at least one arc indication is provided. The diagnosis is based, at least in part, on the operating parameters, the at least one arc indication, and the at least one location of the at least one arc indication. As discussed above, the visible arc detector controller may utilize look up tables and other systems to help in diagnosing why a fault occurred. The visible arc detector controller may also employ machine learning to aid in predicting when arcing may happen and also to prevent cascading events that may severely damage equipment. The visible arc detector controller may interface with the controller of the process chamber and/or other systems to gather process information and chamber status at the time of the arcing and during the time leading up to the arcing to facilitate in determining the cause of the arcing in a particular assembly of the power delivery system.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a “virtual machine” running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A method for detecting arcing in a power delivery system, comprising:

receiving at least one arc indication from at least one arc detection sensor operating in a visible light spectrum, the at least one arc detection sensor positioned in at least one assembly of at least one power delivery system for a plasma process chamber;

determining at least one location of the at least one arc indication by an arc detection controller of the plasma process chamber; and activating at least one safety interlock signal to at least one power source of the at least one power delivery system of the plasma process chamber when the at least one arc indication exceeds a threshold value, the at least one safety interlock signal controlling a power status of the at least one power source wherein activating the at least one safety interlock signal removes power from the at least one power source.

2. The method of claim 1, wherein the at least one arc indication includes intensity of an arc, duration of an arc, or location of an arc within an assembly of the power delivery system.

3. The method of claim 2, wherein one of the at least one arc detection sensor is configured to provide an intensity of an arc in a range of approximately 10,000 lux to approximately 20,000 lux.

4. The method of claim 1, wherein one of the at least one arc detection sensor is a fiber optic sensor.

5. The method of claim 4, wherein a plurality of fiber optic sensors is positioned in one of the at least one assembly of the at least one power delivery system to monitor specific parts.

6. The method of claim 1, wherein one of the at least one arc detection sensor has a 180 degree field of detection.

7. The method of claim 1, wherein one of the at least one arc detection sensor has a 360 degree field of detection.

8. The method of claim 1, further comprising:

receiving operating parameters from a controller of the plasma process chamber associated with a time of the at least one arc indication; and providing a diagnosis of possible causes of the at least one arc indication based, at least in part, on the operating parameters, the at least one arc indication, and the at least one location of the at least one arc indication.

9. The method of claim 8, wherein operating parameters from the controller of the plasma process chamber include chamber pressure, power level, chemistry of a process, impedance match network capacitor positions, or chamber impedance.

10. The method of claim 1, further comprising:

providing an indication of the location of the at least one arc indication, wherein the indication is viewable by personnel operating the plasma process chamber.

11. A method for detecting arcing in a power delivery system, comprising:

receiving at least one arc indication from at least one arc detection sensor operating in a visible light spectrum, the at least one arc detection sensor positioned in at least one assembly of at least one power delivery system for a plasma process chamber, wherein the at least one arc indication includes intensity of an arc, duration of an arc, or location of an arc within an assembly of the power delivery system and wherein at least one arc detection sensor is configured to provide an intensity of an arc in a range of approximately 10,000 lux to approximately 20,000 lux;

determining at least one location of the at least one arc indication by an arc detection controller of the plasma process chamber; and activating at least one safety interlock signal to at least one power source of the at least one power delivery system of the plasma process chamber when the at least one arc indication exceeds a threshold value, the at least one safety interlock signal controlling a power status of the at least one power source wherein activating the at least one safety interlock signal removes power from the at least one power source.

12. The method of claim 11, wherein one of the at least one arc detection sensor is a fiber optic sensor.

13. The method of claim 12, wherein a plurality of fiber optic sensors is positioned in one of the at least one assembly of the at least one power delivery system to monitor specific parts.

14. The method of claim 11, wherein one of the at least one arc detection sensor has a 180 degree field of detection or a 360 degree field of detection.

15. The method of claim 11, further comprising:

receiving operating parameters from a controller of the plasma process chamber associated with an occurrence of the at least one arc indication; and providing a diagnosis of possible causes of the at least one arc indication based, at least in part, on the operating parameters, the at least one arc indication, and the at least one location of the at least one arc indication.

16. The method of claim 15, wherein operating parameters from the controller of the plasma process chamber include chamber pressure, power level, chemistry of a process, impedance match network capacitor positions, or chamber impedance.

17. The method of claim 11, further comprising:

providing an indication of the location of the at least one arc indication, wherein the indication is viewable by personnel operating the plasma process chamber.

18. A non-transitory, computer readable medium having instructions stored thereon that, when executed, cause a method for detecting arcs in a power delivery system to be performed, the method comprising:

receiving at least one arc indication from at least one arc detection sensor operating in a visible light spectrum, the at least one arc detection sensor positioned in at least one assembly of at least one power delivery system for a plasma process chamber;

determining at least one location of the at least one arc indication by an arc detection controller of the plasma process chamber; and activating at least one safety interlock signal to at least one power source of the at least one power delivery system of the plasma process chamber when the at least one arc indication exceeds a threshold value, the at least one safety interlock signal controlling a power status of the at least one power source wherein activating the at least one safety interlock signal removes power from the at least one power source.

19. The non-transitory, computer readable medium of claim 18, wherein the method further comprises:

receiving operating parameters from a controller of the plasma process chamber associated with an occurrence of the at least one arc indication; and providing a diagnosis of possible causes of the at least one arc indication based, at least in part, on the operating parameters, the at least one arc indication, and the at least one location of the at least one arc indication.

20. The non-transitory, computer readable medium of claim 19, wherein operating parameters from the controller of the plasma process chamber include chamber pressure, power level, chemistry of a process, impedance match network capacitor positions, or chamber impedance.

* * * * *